United States Patent [19]

Paprocki

[11] 3,934,194
[45] Jan. 20, 1976

[54] SOLID STATE FLYBACK TRANSFORMER CHECKER

[76] Inventor: Kazimierz Paprocki, 2325 W. Haddon Ave., Chicago, Ill. 60622

[22] Filed: Mar. 26, 1974

[21] Appl. No.: 454,974

[52] U.S. Cl. ................................. 324/51; 324/55
[51] Int. Cl.² ..................................... G01R 31/02
[58] Field of Search ....................... 324/51, 54, 55

[56] References Cited
UNITED STATES PATENTS

| | | | |
|---|---|---|---|
| 3,054,947 | 9/1962 | Kass et al. | 324/51 |
| 3,086,170 | 4/1963 | Kemelhor et al. | 324/51 |
| 3,354,387 | 11/1967 | Whaley et al. | 324/55 |
| 3,529,237 | 9/1970 | Kilchhofer | 324/51 |
| 3,539,923 | 11/1970 | Tsergas | 324/51 |
| 3,769,576 | 10/1973 | Norkaitis | 324/51 |
| 3,789,294 | 1/1974 | Nitta et al. | 324/54 |
| 3,826,977 | 7/1974 | Woodworth | 324/51 |

Primary Examiner—Gerard R. Strecker
Attorney, Agent, or Firm—Olson, Trexler, Wolters, Bushnell & Fosse, Ltd.

[57] ABSTRACT

An instrument for providing information concerning the condition of a horizontal output transformer in a television set.

8 Claims, 2 Drawing Figures

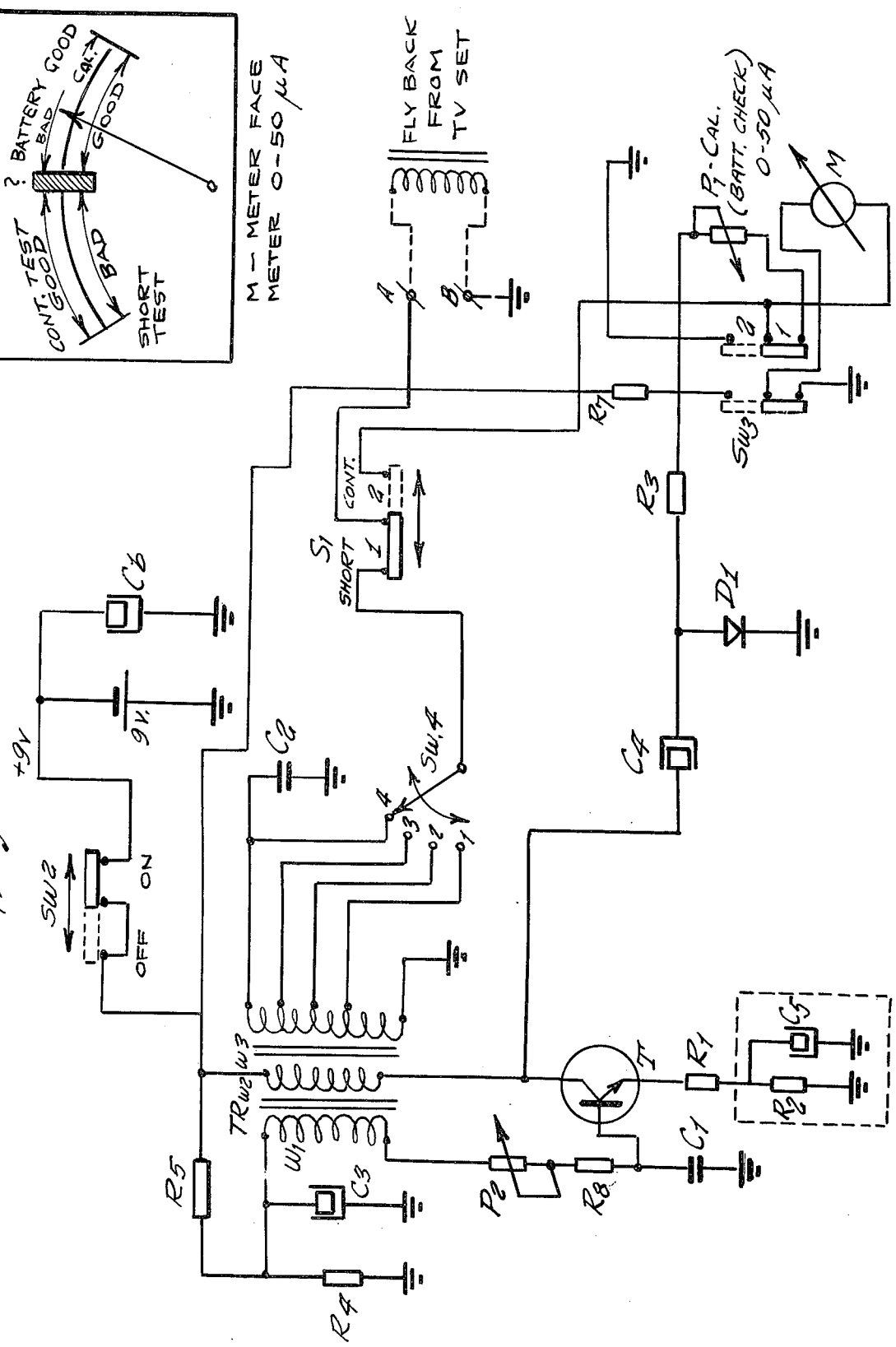

SOLID STATE FLYBACK TRANSFORMER CHECKER

This invention relates generally to television set maintenance equipment.

A principal object of the present invention is to provide a solid state flyback transformer checker for giving a complete information as to the condition of a horizontal output transformer in a television receiver set.

Another object of the present invention is to provide a solid state flyback transformer checker wherein the transformer may have an open winding or a partially shorted winding; the instrument providing a test for either continuity or shorted one or more windings.

Still another object of the present invention is to provide a solid state flyback transformer checker which will save a great deal of time to television technicians.

Other objects of the present invention are to provide a solid state flyback transformer checker which is simple in design, inexpensive to manufacture, rugged in construction, easy to use and efficient in operation.

These and other objects will be readily evident upon a study of the following specification and the accompanying drawing, wherein:

FIG. 1 is an electric circuit of the present invention;

FIG. 2 is a meter face associated with the present invention;

Reference is now made to the drawing in detail, and the following is a circuit description thereof.

The flyback transformer checker contains a NPN transistor connected in an oscillator circuit. The oscillator transformer contains three separate windings: W1- the transistor base winding, W2- the collector winding, and W3- the main winding. The main winding is made of an autotransformer with a few taps in order to provide for the testing of various types of flyback transformers. The unit operates from a 9-volt battery of the flat type commonly used in transistor radios. During a test, the oscillator develops a bidirectional signal having a frequency of approximately 2400 Hertz and reaches a peak value or amplitude, measured between ground and tap No. 4, of approximately 120 volts, although the effective value does not exceed 50 volts; this value being practically harmless to the operator when handling the test leads. A 0–50 $\mu$A meter is used to measure collector voltage rectified by diode D1 to form a unidirectional signal and the indication on this meter is controllable by a potentiometer P1 mounted on the front panel and marked "CAL."

When using the instrument for a "short" test, the flyback transformer under test is connected across the oscillating circuit which, as shown in FIG. 1 comprises capacitor C3, transformer TR, and NPN transistor T. Switch SW2 is placed in the "ON" position and switch SW3 in the No. 1 or "NORMAL" position. In order to make the test, the flyback transformer, which employs the H.V. (high voltage) rectifier (not shown but which is either a tube or solid state device in most television receivers), switch SW4 must be set in postion No. 4 and the flyback transformer is connected to the oscillator circuit, as shown in FIG. 1, by using the leads of the transformer, one of which (e.g., "A") normally is connected to the plate cap of the horizontal amplifier and the other of which (e.g., "B") normally is connected to the plate cap of the high voltage rectifier (not shown).

Taps No. 3, 2 and 1 make it possible to provide for testing of flyback transformers used in solid state and tube-type television receivers employing a voltage tripler circuit instead of a regular high voltage rectifier. A good flyback transformer normally has a high impedance and, when connected across the oscillator, will have little affect on the reading of the meter. However if flyback transformer has any shorted turns in it, in any winding, the shorted section will "absorb" power and this power will be effectively removed from the oscillator causing a decrease in the reading of the meter. In other words, the shorted turns in the transformer being tested reduce the impedance of the transformer so that, when it is connected in parallel with the oscillator circuit, the decreased impedance reduces the magnitude of the unidirectional signal applied to meter M, causing meter M to indicate a lower or "bad" reading.

When using the instrument for a "continuity" test, the switch SW1 is Set in position No. 2 which is marked, continuity. The flyback transformer is connected to terminal A and B and, if it has continuity, it will short one side of the calibrate potentiometer P1 to ground causing the unidirectional signal applied to potentiometer P1 by resistor R3 to be substantially atenuated, which causes the meter indication to drop to an indicated "good" region for transformer continuity.

In order to check the battery's condition, SW3 is set to position No. 2 marked "Battery check." With no flyback transformer connected to terminals A and B, and for a good battery, the meter indication shows in the "battery good" region. To obtain an accurate test, the meter pointer has to be set in position CAL. point and then the flyback transformer may be connected to provide a test.

Thus there is provided a novel solid state flyback transformer checker.

While various changes may be made in the detailed construction, it is understood that such changes will be within the spirit and scope of the present invention as is defined by the appended claims.

What I now claim is:

1. An instrument for determining the relative impedance of a possibly defective transformer, of the type commonly used to develop the high voltage supply in a television receiver, compared with that of a normal transformer of that type, comprising:
   an oscillator circuit for generating a bidirectional signal of a predetermined frequency and amplitude;
   rectifying means coupled to said oscillator circuit for converting said bidirectional signal into a unidirectional signal;
   display means responsive to said unidirectional signal for indicating the magnitude of said unidirectional signal;
   calibration means, including a variable impedance coupled between said rectifying means and said display means for establishing a reference indication for said display means corresponding to the impedance of said normal transformer;
   means for coupling the transformer to be tested in parallel with said oscillator circuit to supply the bidirectional signal to said transformer, whereby the loading on said oscillator circuit caused by the parallel impedance presented by said transformer systematically varies the magnitude of said unidirectional signal relative to said reference indication to thereby cause the display means to indicate whether or not the impedance of the transformer being tested corresponds to that of a normal transformer.

2. A testing instrument according to claim 1, in which said oscillator circuit includes a transformer having three windings, one of said windings having multiple taps and a switch connected thereto, whereby the testing instrument may be used for testing transformers of said type which have different normal impedances.

3. A testing instrument according to claim 1, which further comprises:
    battery means coupled to said oscillator circuit for supplying unidirectional voltage and current to said oscillator circuit, whereby said testing instrument is rendered portable;
    switch means coupled between said display means and said battery means, so that said switch means may be actuated to cause said display means to indicate whether or not the voltage of said battery means is sufficient to power the instrument.

4. A testing instrument in accordance with claim 1, which further comprises switching means connected between said oscillator circuit and said display means, whereby said instrument may be used to determine the continuity of the transformer winding being tested.

5. A testing instrument for determining the relative impedance of a possibly defective transformer, of the type commonly used to develop the high voltage supply in a television receiver, compared with that of a normal transformer of that type, comprising:
    an oscillator circuit, including a three-winding transformer, a capacitor, and a transistor, for generating a bidirectional signal of a predetermined frequency and amplitude;
    rectifying means, including a capacitor connected to the collector of said transistor and a diode connected between said capacitor and ground, for converting said bidirectional signal into a unidirectional signal;
    display means including a microammeter responsive to said unidirectional signal for indicating the magnitude of said unidirectional signal;
    calibration means, including a variable resistor connected between said diode and said microammeter for establishing a reference indication for said display means corresponding to the impedance of said normal transformer;
    means for coupling the transformer to be tested in parallel with said oscillator circuit to supply the bidirectional signal to said transformer, whereby the loading on said oscillator circuit caused by the parallel impedance presented by said transformer decreases the magnitude of said unidirectional signal relative to said reference indication to thereby cause the microammeter to indicate whether or not the impedance of the transformer being tested corresponds to that of a normal transformer.

6. A testing instrument according to claim 5, in which the one of said transformer windings to which the transformer to be tested is connected has multiple taps and a switch connected thereto, whereby the testing instrument may be used for testing transformers of said type which have different normal impedances.

7. A testing instrument according to claim 5, which further comprises:
    battery means coupled to said oscillator circuit for supplying unidirectional voltage and current to said oscillator circuit, whereby said testing instrument is rendered portable;
    switch means coupled between said display means and said battery means, so that said switch means may be actuated to cause said display means to indicate whether or not the voltage of said battery means is sufficient to power the instrument.

8. A testing instrument in accordance with claim 5, which further comprises switching means connected between said oscillator circuit and said microammeter, whereby said instrument may be used to determine the continuity of the transformer winding being tested.

* * * * *